US006168703B1

(12) United States Patent
Lee et al.

(10) Patent No.: US 6,168,703 B1
(45) Date of Patent: Jan. 2, 2001

(54) COPPER FOIL AND LAMINATE CONTAINING A HYDROGEN INHIBITOR

(75) Inventors: Chin-Ho Lee, Lyndhurst; Edward Czapor, Parma, both of OH (US)

(73) Assignee: GA-TEK Inc., Eastlake, OH (US)

( * ) Notice: Under 35 U.S.C. 154(b), the term of this patent shall be extended for 0 days.

(21) Appl. No.: 09/259,848

(22) Filed: Mar. 1, 1999

Related U.S. Application Data

(62) Division of application No. 08/923,566, filed on Sep. 4, 1997, now Pat. No. 5,908,544.

(51) Int. Cl.$^7$ ............... B41M 5/20; C25D 7/00; H01M 4/02
(52) U.S. Cl. ............ 205/50; 205/318; 205/319; 205/243; 205/244; 205/155; 205/156; 428/674
(58) Field of Search ............ 205/50, 316, 318, 205/319, 243, 244, 152, 155, 156; 428/633, 632, 674, 675

(56) References Cited

U.S. PATENT DOCUMENTS

| | | | |
|---|---|---|---|
| 4,387,006 | * 6/1983 | Kajiwara et al. | 205/111 |
| 4,897,317 | 1/1990 | Kanamaru et al. | 428/629 |
| 5,017,271 | 5/1991 | Whewell et al. | |
| 5,071,520 | 12/1991 | Lin et al. | |
| 5,098,796 | * 3/1992 | Lin et al. | 428/607 |
| 5,332,486 | * 7/1994 | DiFranco | 205/50 |
| 5,356,528 | 10/1994 | Fukuda et al. | 205/155 |
| 5,366,814 | * 11/1994 | Yamanishi et al. | 428/607 |
| 5,403,465 | 4/1995 | Apperson et al. | |
| 5,421,985 | 6/1995 | Clouser et al. | |
| 5,447,619 | 9/1995 | Wolski et al. | |
| 5,456,817 | 10/1995 | Hino et al. | |
| 5,552,234 | 9/1996 | Kawasumi et al. | 428/633 |

FOREIGN PATENT DOCUMENTS

| | | |
|---|---|---|
| 0 896 501 A1 * | 2/1999 | (EP) . |
| 56087695 | 7/1981 | (JP) . |
| 61067796 | 4/1986 | (JP) . |
| 5-299834 | 11/1993 | (JP) . |
| 9200405 | 1/1982 | (WO) . |
| 8700212 | 1/1987 | (WO) . |

\* cited by examiner

*Primary Examiner*—Kathryn Gorgos
*Assistant Examiner*—Wesley A. Nicolas
(74) *Attorney, Agent, or Firm*—Michael A. Centanni

(57) ABSTRACT

This invention relates to a process for applying a stabilization layer to at least one side of copper foil comprising contacting said side of said copper foil with an electrolyte solution comprising zinc ions, chromium ions and at least one hydrogen inhibitor. This invention also relates to copper foils treated by the foregoing process, and to laminates comprising a dielectric substrate and copper foil treated by the foregoing process adhered to said dielectric substrate.

12 Claims, No Drawings

COPPER FOIL AND LAMINATE CONTAINING A HYDROGEN INHIBITOR

This application is a divisional of prior application No. 08/923,566, filed Sep. 4, 1997, now U.S. Pat. No. 5,908,544.

TECHNICAL FIELD

This invention relates to a process for treating copper foil and, more particularly, to a process for applying a protective, stabilizing layer to at least one side of copper foil comprising contacting said side of copper foil with an electrolyte solution comprising zinc ions, chromium ions and at least one hydrogen inhibitor. The foils treated by this process are useful in making laminates and printed circuit boards.

BACKGROUND OF THE INVENTION

Copper foil is used in the production of printed circuit boards. Although an excellent electronic conductor, there are problems inherent with the use of such foil. Copper is easily oxidized and corroded. In the production of printed circuit boards, it is generally necessary to bond the copper foil to a dielectric substrate to provide the foil with dimensional and structural stability. As plated or rolled, the adhesion of copper foil to such substrates is generally insufficient. Copper is also known to accelerate or catalyze the decomposition of dielectric substrates. For these reasons, copper foil is typically sold with one or more protective layers applied to its surface.

The current practice for applying adhesion enhancement and protective layers to copper foil typically involves the following sequence of steps. (1) A nodularized or dendritic copper layer is deposited on the foil surface. This dendritic layer can be applied to either the matte side or the shiny side of the foil, or to both sides of the foil. The dendritic layer is applied to roughen and thereby increase mechanical interlocking between the dielectric substrate and foil surface in order to increase the adhesion strength of the foil. (2) A barrier layer is then deposited on the dendritic layer of copper from step (1). This barrier layer is added to prevent thermal degradation of the metal-resin interface, thereby maintaining adhesion of the foil to the resin. (3) A stabilization layer of zinc and chromium is then applied to both sides of the foil. The stabilization layer aids in oxidation resistance, shelf-life and humidity durability. (4) A silane layer is applied over the stabilization layer to enhance adhesion and to improve humidity durability.

In copper foils having a metallic stabilization layer deposited from an electrolyte solution containing no hydrogen inhibitor, two weaknesses have been noted. The first such weakness is the problem of high temperature oxidation ("HTO"), which generally exists at some temperature for any copper foil. The stabilization layer is intended to reduce the HTO problem, but the benefit obtained is limited in known systems.

The second such weakness results from evolution of hydrogen at the metal surface during electrodeposition of the stabilization layer onto the metal surface. Hydrogen evolved at the surface causes local increases in pH, which in turn cause precipitation of dissolved species onto the metal surface, resulting in spots on the finished copper foil.

The prior art has failed to adequately address these weaknesses.

SUMMARY OF THE INVENTION

This invention relates to a process for applying a stabilization layer to at least one side of copper foil comprising contacting said side of said copper foil with an electrolyte solution comprising zinc ions, chromium ions and at least one hydrogen inhibitor. This invention also relates to copper foils treated by the foregoing process, and to laminates comprising a dielectric substrate and the inventive copper foil adhered to said dielectric substrate. An advantage of this invention is that by virtue of the use of the hydrogen inhibitor, the evolution of hydrogen during the inventive process is reduced and the properties of the resulting plated foil are enhanced. Not only does the invention solve the precipitation and spot problems, it also provides an unexpectedly large increase in HTO performance of the treated copper foils.

DESCRIPTION OF THE PREFERRED EMBODIMENTS

The copper foils used with this invention are made using one of two techniques. Wrought or rolled copper foil is produced by mechanically reducing the thickness of a copper or copper alloy strip or ingot by a process such as rolling. Electrodeposited foil is produced by electrolytically depositing copper ions on a rotating cathode drum and then peeling the deposited foil from the cathode. Electrodeposited copper foils are especially useful with this invention.

The copper foils typically have nominal thicknesses ranging from about 0.0002 inch to about 0.02 inch. Copper foil thickness is sometimes expressed in terms of weight and typically the foils of the present invention have weights or thicknesses ranging from about $\frac{1}{8}$ to about 14 ounces per square foot ($oz/ft^2$). Especially useful copper foils are those having weights of $\frac{1}{2}$, 1 or 2 $oz/ft^2$.

Electrodeposited copper foils have a smooth or shiny (drum) side and a rough or matte (copper deposit growth front) side. The stabilization layer applied by the inventive process can be applied to either side of the foil, and in some instances it is applied to both sides. In one embodiment, the layer applied by the inventive process is applied to the matte side of the foil. In one embodiment, the layer applied by the inventive process is applied to the shiny side of the foil.

The side or sides of the foil to which the layer applied by the inventive process overlies can be a "standard-profile surface," "low-profile surface" or "very-low-profile surface." Useful embodiments involve the use of foils with low-profile surfaces and very low-profile surfaces. The term "standard-profile surface" is used herein to refer to a foil surface having an $R_{tm}$ of about 10 microns or less. The term "low-profile surface" refers to a foil surface having an $R_{tm}$ of about 7 microns or less. The term "very-low-profile surface" refers to a foil surface having an $R_{tm}$ of about 4 microns or less. $R_{tm}$ is the mean of the maximum peak-to-valley vertical measurement from each of five consecutive sampling measurements, and can be measured using a SURTRONIC 3 profilometer marketed by Rank Taylor Hobson, Ltd., Leicester, England.

The source of zinc ions for the electrolyte solution can be any zinc salt, examples include $ZnSO_4$, $ZnCO_3$, $ZnCrO_4$, etc.

The source of chromium ions for the electrolyte solution can be any hexavalent chromium salt or compound, examples include $ZnCrO_4$, $CrO_3$, etc.

The hydrogen inhibitor can be any additive for the electrolyte solution that inhibits hydrogen evolution during the inventive plating process. These include the following ions: $P^{+3}$, $W^{+6}$, $V^{+5}$, $As^{+3}$, $Pb^{+2}$, $Pb^{+4}$, $Hg^{+1}$, $Hg^{+2}$, $Cd^{+2}$ or quatemary ammonium ions. $P^{+3}$, $W^{+6}$ and $V^{+5}$ are particularly useful and $P^{+3}$ is especially useful. Sources for these ions include $H_3PO_3$, $Na_2WO_4$, $Na_3VO_4HAsO_3$, $Pb(NO_3)_2$, $Pb(NO_3)_4$, $Hg_2SO_4$, $HgSO_4$, $CdSO_4$, and the like.

The quaternary ammonium ions can be any compound represented by the formula

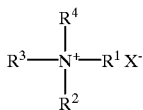

wherein $R^1$, $R^2$, $R^3$ and $R^4$ are, independently hydrocarbon groups of 1 to about 16 carbon atoms, and in one embodiment 1 to about 8 carbon atoms, and in one embodiment about 4 carbon atoms, and $X^-$ is an anion such as $Cl^-$, $OH^-$ or other such anion, which acts as a counterion to the quaternary ammonium. Sources of these quaternary ions include tetrabutyl ammonium hydroxide.

The concentration of zinc ions in the electrolyte solution is generally in the range of about 0.1 to about 2 g/l, and in one embodiment about 0.3 to about 0.6 g/l, and in one embodiment about 0.4 to about 0.5 g/l, and in one embodiment about 0.45 g/l. The concentration of chromium ions in the electrolyte solution is generally in the range of about 0.3 to about 5 g/l, and in one embodiment about 0.5 to about 3 g/l, and in one embodiment about 0.5 to about 1.0 g/l, in one embodiment about 0.65 to about 0.85 g/l in one embodiment about 0.6 g/l, in one embodiment about 0.75 g/l, in one embodiment about 1.0 g/l, and in one embodiment about 1.9 g/l. The concentration of hydrogen inhibitor ions is generally in the range of about 5 ppm to about 1000 ppm, and in one embodiment about 100 ppm to about 500 ppm. In one embodiment, the concentration of $p^{+3}$ ions in the electrolyte solution is in the range of about 100 ppm to about 500 ppm, and in one embodiment about 150 ppm to about 250 ppm, and in one embodiment about 200 ppm.

The electrolyte solution can include other conventional additives such as $Na_2SO_4$ at concentrations in the range of about 1 to about 50 g/l, in one embodiment about 10 to about 20 g/l, in one embodiment about 12 to about 18 g/l, in one embodiment about 15 g/l, and in one embodiment about 8.5 g/l. The pH used in the electrolyte solution is generally in the range of about 3 to about 6, and in one embodiment about 4 to about 5, in one embodiment about 4.8 to 5.0, and in one embodiment about 4.5.

The current density is generally in the range of about 1 to about 100 amps/ft$^2$, and in one embodiment about 25 to about 50 amps/ft$^2$, and in one embodiment about 30 amps/ft$^2$. Where multiple anodes are employed, the current density may be varied between the anodes. In one embodiment, in which 3 anodes are employed, the current density is from about 5 to about 65 amps/ft$^2$ on the first two anodes and from about 1 to about 15 amps/ft$^2$ on the third anode. In one embodiment, using three anodes, the current density is from about 10 to about 45 amps/ft$^2$ on the first two anodes and from about 1 to about 10 amps/ft$^2$ on the third anode depending on line speed. In one embodiment, using three anodes, the current density is about 12 amps/ft$^2$ on the first two anodes and about 1.8 amps/ft$^2$ on the third anode. In one embodiment, using three anodes the current density on the first two anodes is about 36 amps/ft$^2$ and on the third anode about 2 amps/ft$^2$. In one embodiment using three anodes the current density is between about 18 and about 25 amps/ft$^2$ on the first two anodes and about 2.0 amps/ft$^2$ on the third anode.

Generally, the line speeds and current densities vary as suggested by the following data:

| First & Second Anodes: | | |
|---|---|---|
| Line Speed | Current Density | Approximate Range |
| 20–50 ft/min. | 35 amps/ft$^2$ | ±10 amps/ft$^2$ |
| 50–100 ft/min. | 25 amps/ft$^2$ | ±5 amps/ft$^2$ |
| 100–150 ft/min. | 12 amps/ft$^2$ | ±5 amps/ft$^2$ |

Third Anode: 1–10 amps/ft$^2$ varied with line speed.

The temperature of the electrolyte solution is generally in the range of about 20° C. to about 100° C., and in one embodiment about 25° C. to about 45° C., and in one embodiment from about 26° C. to about 44° C., and in one embodiment about 35° C. The plating time that is used is generally in the range of about 1 to about 30 seconds, and in one embodiment about 5 to about 20 seconds, and in one embodiment about 15 seconds. In one embodiment, the total treatment time on the shiny or smooth side is from about 3 to about 10 seconds, and on the matte side is from about 1 to about 5 seconds. In one embodiment, the total treatment time is from about 1.5 to about 2.0 seconds. In one embodiment the treatment time is about 5.5 seconds on the shiny side and about 2.75 seconds on the matte side.

In one embodiment, the mole ratio of chromium ions to zinc ions in the electrolyte solution is in the range of about 0.2 to about 10, and in one embodiment about 1 to about 5, and in one embodiment about 1.4, and in one embodiment about 4.1, and in one embodiment about 2.4. The mole ratio of zinc ions to hydrogen inhibitor ions in the electrolyte solution is, in one embodiment, in the range of about 0.4 to about 10, in one embodiment about 1 to about 2, in one embodiment about 1.2, and in one embodiment about 1.35.

The thickness of the stabilization layer that is applied to the copper foil in accordance with the inventive process is generally in the range of about 0.001 to about 0.5 micron, and in one embodiment about 0.005 to about 0.01 micron.

In one embodiment, the inventive stabilization layer overlies the matte side of the foil. In one embodiment it overlies the shiny side of the foil. In one embodiment, it overlies both sides of the foil.

In one embodiment, the inventive stabilization layer is the sole metallic layer applied to a side of the foil. In this embodiment, the inventive stabilization layer is the sole metallic layer applied to either the matte side, shiny side, or both sides of the foil. In this embodiment, an optional silane coupling agent can be applied to overlie the inventive stabilization layer. The application of such silane coupling agents is discussed in greater detail below.

In one embodiment, the inventive stabilization layer is characterized by the absence of copper.

In one embodiment, the base surface of the side or sides of the foil to which the inventive stabilization layer is applied is untreated prior to the application of the inventive stabilization layer to the foil. The term "untreated" is used herein to refer to the base surface of a foil that has not undergone subsequent treatment for the purpose of refining or enhancing the foil properties. In one embodiment, the untreated foils have a naturally occurring, non-dendritic or non-nodular layer of copper oxide adhered to the base surface thereof.

In one embodiment, a dendritic or nodular layer of copper or copper oxide is applied to the base surface of the foil prior to the application of the inventive stabilization layer. This copper or copper oxide layer can have a thickness in the range of about 0.1 to about 5 microns, and in one embodiment about 1 to about 3 microns. The inventive stabilization layer can be applied over this copper or copper oxide layer. Procedures for applying these copper or copper oxide layers are known in the art. In one embodiment, the inventive copper foil is characterized by the absence of such a dendritic or nodular layer of copper or copper oxide.

In one embodiment, the inventive copper foil has the inventive stabilization layer overlying a metallic layer, and the foil is characterized by the absence of a dendritic or nodular layer of copper or copper oxide underlying the metallic layer.

A silane coupling agent can be applied over the inventive stabilization layer. The silane coupling agent can be represented by the formula $$R_{4-n}SiX_n$$

wherein R is a functionally substituted hydrocarbon group, the functional substituent of said functionally substituted hydrocarbon group being amino, hydroxy, halo, mercapto, alkoxy, acyl, or epoxy; X is a hydrolyzable group, such as alkoxy (e.g., methoxy, ethoxy, etc.), or halogen (e.g., chlorine); and n is 1, 2 or 3, and preferably n is 3. The silane coupling agents represented by the above formula include halosilanes, aminoalkoxysilanes, aminophenylsilanes, phenylsilanes, heterocyclic silanes, N-heterocyclic silanes, acrylic silanes, mercapto silanes, and mixture of two or more thereof.

Useful silane coupling agents include those selected from the group consisting of aminopropyltrimethoxy silane, tetramethoxy silane, tetraethoxy silane, bis(2-hydroxyethyl)-3-aminopropyltriethoxy silane, 3-(N-styrylmethyl-2-aminoethylamine) propyltrimethoxy silane, 3-glycidoxypropyltrimethoxy silane, N-methylaminopropyltrimethoxy silane, 2-(2-aminoethyl-3-aminopropyl)trimethoxy silane, and N-phenylaminopropyltrimethoxy silane.

A useful silane coupling agent mixture is 3-glycidoxypropyltrimethoxy silane, and tetramethoxy silane or tetraethoxy silane. The weight ratio of the former to the latter can range from about 1:10 to about 10:1, and in one embodiment about 1:5 to about 5:1, and in one embodiment the weight ratio is about 4:1.

A useful silane coupling agent mixture is N-methylaminopropyltrimethoxy silane and chloropropyltrimethoxy silane. The weight ratio of the former to the latter can range from about 1:10 to about 10:1, and in one embodiment about 1:5 to about 5:1, and in one embodiment the weight ratio is about 1:1.

A useful silane coupling agent mixture is 3-(N-styrylmethyl-2-aminoethyl amino)propyltrimethoxy silane and N-methylaminopropyltrimethoxy silane. The weight ratio of the former to the latter can range from about 1:10 to about 10:1, and in one embodiment about 1:5 to about 5:1, and in one embodiment the weight ratio is about 1:1.

A useful silane coupling agent mixture is 3-glycidoxypropyltrimethoxy silane and N-methylaminopropyltrimethoxy silane. The weight ratio of the former to the latter can range from about 1:10 to about 10:1, and in one embodiment about 1:5 to about 5:1, and in one embodiment the weight ratio is about 1:3.

The coating of the foil surface with the silane coupling agent may be effected by applying the silane coupling agent alone to the surface of the foil. However, it is generally preferred that coating be effected by applying the silane coupling agent in a suitable medium to the foil surface. More specifically, the silane coupling agent can be applied to the foil surface in the form of a solution in water, a mixture of water and alcohol, or a suitable organic solvent, or as an aqueous emulsion of the silane coupling agent, or as an aqueous emulsion of a solution of the silane coupling agent in a suitable organic solvent. Conventional organic solvents may be used for the silane coupling agent and include, for example, alcohols, ethers, ketones, and mixtures of these with aliphatic or aromatic hydrocarbons or with amides such as N,N-dimethylformamide. Useful solvents are those having good wetting and drying properties and include, for example, water, ethanol, isopropanol, and methylethylketone. Aqueous emulsions of the silane coupling agent may be formed in conventional manner using conventional dispersants and surfactants, including non-ionic dispersants. It may be convenient to contact the metal surface with an aqueous emulsion of the silane coupling agent. The concentration of the silane coupling agent in such solutions or emulsions can be up to about 100% by weight of the silane coupling agent, and in one embodiment is in the range of about 0.1% to about 5% by weight, and in one embodiment about 0.3% to about 1% by weight. The process of coating with the silane coupling agent may be repeated, if desired, several times. The silane coupling agent may be applied to the foil surface using known application methods which include reverse roller coating, doctor blade coating, dipping, painting and spraying.

The application of the silane coupling agent to the foil surface is typically effected at a temperature of about 15° C. to about 45° C., and in one embodiment about 20° C. to about 30° C. Following application of the silane coupling agent to the foil surface, the silane coupling agent can be heated to a temperature of about 60° C. to about 170° C., and in one embodiment about 90° C. to 150° C., for generally about 0.1 to about 5 minutes, and in one embodiment about 0.2 to about 2 minutes to enhance drying of the surface. The dry film thickness of the silane coupling agent on the foil is generally from about 0.002 to about 0.1 micron, and in one embodiment about 0.005 to about 0.02 microns.

The inventive copper foils can be bonded to dielectric substrates to provide dimensional and structural stability thereto. Useful dielectric substrates may be prepared by impregnating woven glass reinforcement materials with partially cured resins, usually epoxy resins (e.g., difunctional, tetrafunctional and multifunctional epoxies). Other useful resins include amino type resins produced from the reaction of formaldehyde and urea or formaldehyde and melamine, polyesters, phenolics, silicones, polyamides, polyimides, di-allyl phthalates, phenylsilanes, polybenizimidazoles, diphenyloxides, polytetrafluoroethylenes, cyanate esters, and the like. These dielectric substrates are sometimes referred to as prepregs.

In preparing the laminates, it is useful for both the prepreg material and the copper foil to be provided in the form of long webs of material rolled up in rolls. In one embodiment these long webs of foil and prepreg are laminated using a continuous process. In this process a continuous web of the foil is brought into contact with a continuous web of prepreg material under laminating conditions to form a laminate structure. This laminate structure is then cut into rectangular sheets and the rectangular sheets are laid-up or assembled in stacks of assemblages.

In one embodiment, the long webs of foil and prepreg material are first cut into rectangular sheets and then subjected to lamination. In this process rectangular sheets of the foil and rectangular sheets of the prepreg material are laid-up or assembled in stacks of assemblages.

Each assemblage may comprise a prepreg sheet with a sheet of foil on either side thereof. The assemblage may be subjected to conventional laminating temperatures and pressures between the plates of laminating presses to prepare laminates comprising sandwiches of a sheet of prepreg between sheets of copper foil.

The prepregs may consist of a woven glass reinforcement fabric impregnated with a partially cured two-stage resin. By application of heat and pressure, the copper foil is pressed tightly against the prepreg and the temperature to which the assemblage is subjected activates the resin to cause curing, that is crosslinking of the resin and thus tight bonding of the foil to the prepreg dielectric substrate. Generally speaking, the laminating operation will involve pressures in the range of from about 250 to about 750 psi, temperatures in the range of from about 175° C. to 235° C. and a laminating cycle of from about 40 minutes to about 2 hours. The finished laminate may then be utilized to prepare printed circuit boards (PCB).

In one embodiment, the laminate is subjected to a subtractive copper etching process to form electrically conductive lines or an electrically conductive pattern as part of a process for making a multilayered circuit board. A second prepreg is then adhered to the etched pattern. Techniques for making multilayered circuit boards are well known in the art. Similarly, subtractive etching processes are well known, an example of which is disclosed in U.S. Pat. No. 5,017,271, which is incorporated herein by reference.

A number of manufacturing methods are available for preparing PCBs from laminates. Additionally, there is a myriad of possible end use applications including radios, televisions, computers, etc., for the PCB's. These methods and end uses are known in the art.

The following examples are provided for purposes of illustrating the invention. Unless otherwise indicated, in the following examples as well as throughout the specification and claims, all parts and percentages are by weight, all temperatures are in degrees Celsius, and all pressures are atmospheric.

EXAMPLE 1

A class 1 raw electrodeposited copper foil sample having a weight of one oz/ft$^2$ was plated on both sides with a stabilization layer under the following conditions:

Zinc as $ZnSO_4$: 0.52 g/l

Chromium as $CrO_3$: 0.59 g/l $P^{+3}$ as $H_3PO_3$: none $Na_2SO_4$: 10 g/l

Bath pH: 5.0

Current density: 12.2 amps/ft$^2$ in each of the first two anodes, 1.8 amps/ft$^2$ in the third anode Plating time: 5.5 seconds—shiny side 2.75 seconds—matte side Bath temperature: 35° C.

The stabilization-treated foil was treated with a silane by dipping the sample in a 0.5% by weight solution containing an 80:20 weight ratio mixture of 3-glycidoxypropyltrimethoxysilane and tetramethoxysilane. The sample was dried and laminated to a difunctional epoxy prepreg. ICP analysis* showed that the shiny side film contains 109 µg/dm$^2$ zinc and 32 µg/dm$^2$ chromium. The sample was tested for appearance, shiny-side HTO and cleanability, matte side initial peel strength, HCI-undercut* and thermal aging**** with the following results:

Appearance: spots visible on matte side, via SEM screen, 150×

Shiny-side HTO: Pass, 1–2 hr. at 190° C.

Fail, 0.5 hr. at 250° C. Cleanability: Acceptable

Matte side:

Initial peel strength: 11.8 lb/in

HCI undercut: 2.2%

Thermal age peel loss: 18.3%

*ICP analysis is determined by dissolving the layer with HCI and analyzing by ICP.

**Cleanability was tested with 20% HCI.

***HCI-undercut is a measure of percent peel strength loss after soaking the sample for one hour in 18% HCI.

****Thermal aging is a measure of percent peel strength loss after heat treating the sample at 177° C. for 48 hours.

EXAMPLE 2

A class 1 raw electrodeposited copper foil sample having a weight of one oz/ft$^2$ was plated on both sides with a stabilization layer under the following conditions:

Zinc as $ZnSO_4$: 0.52 g/l

Chromium as $CrO_3$: 0.59 g/l $P^{+3}$ as $H_3PO_3$: 200 ppm $Na_2SO_4$: 10 g/l

Bath pH: 5.0

Current density: 36 amps/ft$^2$ in each of the first two anodes, 1.8 amps/ft$^2$ in the third anode Plating time: 5.5 seconds—shiny side 2.75 seconds—matter side Bath temperature: 35° C.

The stabilization-treated foil was treated with a silane by dipping the sample in a 0.5% by weight solution containing an 80:20 weight ratio mixture of 3-glycidoxypropyltrimethoxysilane and tetramethoxysilane. The sample was dried and laminated to a difunctional epoxy prepreg. ICP analysis showed that the shiny side film contains 108 µg/dm$^2$ zinc, 23 µg/dm$^2$ chromium, and about 5 µg/dm$^2$ phosphorus. The sample was tested for appearance, shiny-side HTO, matte side initial peel strength, HCI-undercut and thermal aging with the following results:

Appearance: Spot Free

Shiny-side HTO: Pass, 5 hr. at 250° C.

Matte side:

initial peel strength: 11.4 lb/in

HCI undercut: 15.8%

Thermal age peel loss: 15.0%

EXAMPLE 3

A class 1 raw electrodeposited copper foil sample a having weight of one oz/ft$^2$ was plated on both sides with a stabilization layer under the following conditions:

Zinc as $ZnSO_4$: 0.52 g/l

Chromium as $CrO_3$: 0.98 g/l $P^{+3}$ as $H_3PO_3$: 200 ppm $Na_2SO_4$: 10 g/l

Bath pH: 4.2

Current density: 36 amps/ft$^2$ in each of the first two anodes, 1.8 amps/ft$^2$ in the third anode Plating time: 5.5 seconds—shiny side 2.75 seconds—matter side Bath temperature: 35° C.

The stabilization-treated foil was treated with a silane by dipping the samples in a 0.5% by weight solution containing an 80:20 weight ratio mixture of 3-glycidoxypropyltrimethoxysilane and tetramethoxysilane. The sample was dried and laminated to a difunctional epoxy prepreg. The samples were tested for appearance, shiny-side HTO, matte side initial peel strength, HCI-undercut and thermal aging with the following results:

Appearance: Spot Free
Shiny-side HTO: Pass, 4 hr. at 250° C.
Matte side:
   initial peel strength: 11.6 lb/in
   HCI undercut: 8.4%
   Thermal age peel loss: 15.8%

EXAMPLE 4

Four samples of a class 1 raw electrodeposited copper foil each having weight of one oz/ft$^2$ were plated on both sides with a stabilization layer under the following conditions:

Zinc as $ZnSO_4$: 0.58 g/l
   Chromium as $CrO_3$: 1.9 g/l
   $P^{+3}$ as $H_3PO_3$: 0–203 ppm, see table below
   $Na_2SO_4$: 8.5 g/l
   Bath pH: 4.8–5.0
   Current density: 18–25 amps/ft$^2$
   Plating time: 1.5–1.9 seconds
   Bath temperature: 35° C.

The samples were dried and laminated to a difunctional epoxy prepreg. The samples were tested for appearance, shiny-side HTO, matte side initial peel strength, HCI-undercut and thermal aging with the following results:

TABLE 1

| | HTO Ranking[‡] | | | |
|---|---|---|---|---|
| ppm $P^{+3}$ | 1 hr @ 210° C. | ½ hr @ 250° C. | 1 hr @ 250° C. | 2 hr @ 250° C. |
| 0 | 5 | N/A | N/A | N/A |
| 56 | 4 | 5 | N/A | N/A |
| 95 | 1.5 | 2 | N/A | N/A |
| 203 | N/A | 1 | 1 | 1 |

[‡]Values from 1–5, 1 is best, 5 is worst.

Matte side:
   initial peel strength: ~13 lb/in
   HCI undercut: <6%
   Thermal age peel loss: <18%

EXAMPLE 5

Class 1 electrodeposited copper foil samples having weights of one oz/ft$^2$ were plated on both sides with a stabilization layer in accordance with the invention, under the following conditions:

Zinc as $ZnSO_4$: 0.45 g/l
   Chromium as $CrO_3$: 0.75 g/l
   $P^{+3}$ as $H_3PO_3$: 0.2 g/l
   $Na_2SO_4$: 15 g/l
   Bath pH: 4.5
   Current density: 30 amps/ft$^2$ first and second anodes; 5 amps/ft$^2$ third anode
   Plating time: 8 seconds—shiny side
      5 seconds—matte side
   Bath temperature: 35° C.

The stabilization layer treated samples were tested by X-ray Photoelectron Spectroscopy (XPS) analysis to determine the quantities of various elements deposited upon the copper foil by the stabilization process of the present invention. The results obtained are shown in Table 2;

TABLE 2

| | Atomic Concentration Data (%) | | | | |
|---|---|---|---|---|---|
| Element | Sample 1 | Sample 2 | Sample 3 | Sample 4 | Sample 5 |
| Zinc | 18.6 | 16.4 | 18.4 | 16.2 | 13.4 |
| Copper | 1.0 | 1.3 | 0.7 | 0.7 | 1.0 |
| Chromium | 6.9 | 6.6 | 6.9 | 5.7 | 6.2 |
| Oxygen | 53.7 | 51.3 | 52.5 | 50.6 | 47.6 |
| Carbon | 15.8 | 21.3 | 18.6 | 23.1 | 28.1 |
| Phosphorus | 4.1 | 3.2 | 2.9 | 3.8 | 3.7 |
| Zn/Cr | 2.67 | 2.49 | 2.68 | 2.87 | 2.15 |

EXAMPLE 6

Class 1 electrodeposited copper foil samples having weights of one oz/ft$^2$ were plated on both sides with a stabilization layer in accordance with the invention, on a separate production line from Example 5, under the following conditions:

Zinc as $ZnSO_4$: 0.45 g/l
   Chromium as $CrO_3$: 0.75 g/l
   $P^{+3}$ as $H_3PO_3$: 0.2 g/l
   $Na_2SO_4$: 15 g/l
   Bath pH: 4.5
   Current density: 25 amps/ft$^2$ first and second anodes
   Plating time: 10 seconds
   Bath temperature: 35° C.

The stabilization layer treated samples were tested by X-ray Photoelectron Spectroscopy (XPS) analysis to determine the quantities of various elements deposited upon the copper foil by the stabilization process of the present invention. The results obtained are shown in Table 3;

TABLE 3

| | Atomic Concentration Data (%) | | | | | |
|---|---|---|---|---|---|---|
| Element | Sample 1 | Sample 2 | Sample 3 | Sample 4 | Sample 5 | Sample 6 |
| Zinc | 8.8 | 15.1 | 12.9 | 14.9 | 12.4 | 14.2 |
| Copper | 0.9 | 1.7 | 1.0 | 0.8 | 0.6 | 0.9 |
| Chromium | 6.5 | 8.1 | 6.3 | 7.2 | 6.1 | 6.6 |
| Oxygen | 40.3 | 52.7 | 50.7 | 51.1 | 46.5 | 51.0 |
| Carbon | 40.9 | 19.1 | 25.5 | 22.5 | 30.2 | 24.4 |
| Chlorine | ND | ND | ND | ND | 0.7 | ND |
| Sulfur | ND | 0.6 | ND | ND | ND | ND |
| Silicon | 0.8 | 0.7 | 0.8 | 1.1 | 1.1 | ND |
| Phosphorus | 1.9 | 2.0 | 2.8 | 2.3 | 2.4 | 2.8 |
| Zn/Cr | 1.36 | 1.86 | 2.04 | 2.06 | 2.04 | 2.15 |

EXAMPLE 7

Class 1 electrodeposited copper foil samples having weights of one oz/ft$^2$ were plated on both sides with a stabilization layer on a production line, with and without phosphorous acid as a hydrogen inhibitor, under the following conditions:

Zinc as $ZnSO_4$: 0.45 g/l
   Chromium as $CrO_3$: 0.75 g/l
   $P^{+3}$ as $H_3PO_3$: As shown below
   $Na_2SO_4$: 15 g/l
   Bath pH: 4.5

Current density: 35 amps/ft² first and second anodes;
5 amps/ft² third anode
Plating time: 10 seconds
Bath temperature: 35° C.

The stabilization layer treated samples were tested by ICP, which gave the following results:

| Treatment | Zn, (mg/dm²) | Cr, (mg/dm²) | P, (mg/dm²) |
|---|---|---|---|
| 200 ppm P$^{+3}$ | 0.06–0.12 | 0.015–0.025 | 0.005–0.010 |
| no P$^{+3}$ | 0.10–0.20 | 0.03–0.035 | None Detected |

In general, the shiny-side Zn and Cr are lower when the hydrogen inhibitor of the present invention is present in the electrolyte from which the stabilization layer is formed.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A copper foil with a stabilization layer overlying at least one side of said foil, said stabilization layer being applied to said side of said foil by the process comprising contacting said side of said copper foil with an electrolyte solution comprising zinc ions, chromium ions and at least one hydrogen inhibitor, wherein said hydrogen inhibitor comprises an ion selected from the group consisting of P$^{+3}$, Pb$^{+2}$, Pb$^{+4}$, Hg$^{+1}$, Hg$^{+2}$, Cd$^{+2}$ and quaternary ammonium ions.

2. The foil of claim 1 wherein said hydrogen inhibitor is P$^{+3}$.

3. The foil of claim 1 wherein said foil is one of an electrodeposited copper foil or a wrought copper foil.

4. The foil of claim 1 wherein the side of said foil that is contacted with said electrolyte solution has a surface selected from a standard-profile surface having an R$_{tm}$ of about 10 microns or less, a low-profile surface having an R$_{tm}$ of about 7 microns or less, and a very low-profile surface having an R$_{tm}$ of about 4 microns or less.

5. The foil of claim 1 further comprising a dendritic layer of copper or copper oxide between said foil and said stabilization layer.

6. The foil of claim 1 further comprising a silane coupling agent overlying said stabilization layer.

7. A laminate comprising a dielectric substrate and a copper foil adhered to said dielectric substrate, said copper foil having a stabilization layer adhered to at least one side of said foil, said stabilization layer being applied to said side of said copper foil by the process comprising contacting said side of said copper foil with an electrolyte solution comprising zinc ions, chromium ions, and at least one hydrogen inhibitor, wherein said hydrogen inhibitor comprises an ion selected from the group consisting of P$^{+3}$, Pb$^{+2}$, Pb$^{+4}$, Hg$^{+1}$, Hg$^{+2}$, Cd$^{+2}$ and quaternary ammonium ions.

8. The foil of claim 7 wherein said hydrogen inhibitor is P$^{+3}$.

9. The foil of claim 7 wherein said foil is one of an electrodeposited copper foil or a wrought copper foil.

10. The foil of claim 7 wherein the side of said foil that is contacted with said electrolyte solution has a surface selected from a standard-profile surface having an R$_{tm}$ of about 10 microns or less, a low-profile surface having an R$_{tm}$ of about 7 microns or less, and a very low-profile surface having an R$_{tm}$ of about 4 microns or less.

11. The foil of claim 7 further comprising a dendritic layer of copper or copper oxide between said foil and said stabilization layer.

12. The foil of claim 7 further comprising a silane coupling agent overlying said stabilization layer.

* * * * *